United States Patent
Roohparvar

(10) Patent No.: US 6,952,045 B2
(45) Date of Patent: Oct. 4, 2005

(54) MEMORY DEVICE POWER DISTRIBUTION IN ELECTRONIC SYSTEMS

(75) Inventor: Frankie F. Roohparvar, Miltitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/348,536

(22) Filed: Jan. 21, 2003

(65) Prior Publication Data

US 2003/0107122 A1 Jun. 12, 2003

Related U.S. Application Data

(62) Division of application No. 09/648,880, filed on Aug. 25, 2000, now Pat. No. 6,541,849.

(51) Int. Cl.$^7$ .............................................. H01L 23/495
(52) U.S. Cl. ...................... 257/666; 257/773; 257/784
(58) Field of Search .............................. 257/666, 672, 257/674, 676, 691, 692, 773, 784, 786, 696, 697, 693, 207

(56) References Cited

U.S. PATENT DOCUMENTS

| | | |
|---|---|---|
| 5,041,886 A | 8/1991 | Lee |
| 5,523,617 A | 6/1996 | Asanasavest |
| 5,537,354 A | 7/1996 | Mochizuki et al. |
| 5,600,605 A | 2/1997 | Schaefer |
| 5,666,321 A | 9/1997 | Schaefer |
| 5,726,860 A | 3/1998 | Mozdzen |
| 5,751,039 A | 5/1998 | Kauffman et al. |
| 5,787,457 A | 7/1998 | Miller et al. |
| 5,880,987 A | 3/1999 | Merritt |
| 5,907,186 A | 5/1999 | Kang et al. |
| 5,936,903 A | 8/1999 | Jeng et al. |
| 5,955,777 A | 9/1999 | Corisis et al. |
| 5,995,438 A | 11/1999 | Jeng et al. |
| 6,026,465 A | 2/2000 | Mills et al. |
| 6,083,777 A | 7/2000 | King et al. |
| 6,097,081 A | 8/2000 | Masuda et al. |
| 6,104,667 A | 8/2000 | Akaogi |
| 6,107,677 A | 8/2000 | Schoenfeld et al. |
| 6,114,749 A | 9/2000 | Chia |
| 6,114,751 A | 9/2000 | Kumakura et al. |

(Continued)

OTHER PUBLICATIONS

Keeth, et al., "DRAM circuit design: a tutorial," IEEE Press, 2001, pp. 16–23, 142–153.
Micron Semiconductor Products, Inc., "2Mb, Smart 5 BIOS–Optimized Boot Block Flash Memory," *Flash Memory* www.micron.com, copyright 2000, Micron Technology, Inc., pp. 1–12.
Micron, "16 Mb: x16 SDRAM" *Synchronous DRAM*, www.micron.com, copyright 1999 Micron Technology, Inc., pp. 1–51.

*Primary Examiner*—Hoai Pham
*Assistant Examiner*—DiLinh Nguyen
(74) *Attorney, Agent, or Firm*—Leffert Jay & Polglaze, PA

(57) ABSTRACT

Electronic systems including memory devices arranged to be mounted in a memory package with the major axis of the memory chip aligned substantially parallel with the major axis of its memory package. Memory chips include a first power input chip bond pad in each of at least three quadrants of the memory chip. Memory chips include a second power input chip bond pad in each of at least three quadrants of the memory chip. The chip bond pads are interposed between memory banks of the memory device and the sides of the memory chip containing the memory device. Memory assemblies include memory chips having chip bond pads on both sides of the memory chip shorted to each other by a single lead of a leadframe. Memory chips of various embodiments contain memory devices having banks of non-volatile flash memory cells whose access commands are synchronized to a system clock.

18 Claims, 6 Drawing Sheets

U.S. PATENT DOCUMENTS

| | | | |
|---|---|---|---|
| 6,124,150 A | * | 9/2000 | Corisis ........................ 438/123 |
| RE36,907 E | | 10/2000 | Templeton, Jr. et al. |
| 6,130,114 A | | 10/2000 | Murakami et al. |
| 6,137,133 A | | 10/2000 | Kauffman et al. |
| 6,141,247 A | | 10/2000 | Roohparvar et al. |
| 6,148,509 A | | 11/2000 | Schoenfeld et al. |
| 6,268,643 B1 | * | 7/2001 | Russell ........................ 257/666 |
| 6,317,370 B2 | * | 11/2001 | Shirley ........................ 365/200 |
| 6,541,849 B1 | * | 4/2003 | Roohparvar ................ 257/691 |

* cited by examiner

MEMORY DEVICE POWER DISTRIBUTION IN ELECTRONIC SYSTEMS

RELATED APPLICATION

This application is a divisional of U.S. patent application Ser. No. 09/648,880, filed Aug. 25, 2000 and titled, "MEMORY DEVICE POWER DISTRIBUTION," now U.S. Pat. No. 6,541,849, issued Apr. 1, 2003, which is commonly assigned and incorporated by reference in its entirety herein.

TECHNICAL FIELD OF THE INVENTION

The present invention relates generally to semiconductor memory devices, and in particular, the present invention relates to power distribution for semiconductor memory devices.

BACKGROUND OF THE INVENTION

Memory devices are typically provided as internal storage areas in the computer. The term memory identifies data storage that comes in the form of integrated circuit chips. There are several different types of memory. One type is RAM (random-access memory). This is typically used as main memory in a computer environment. RAM refers to read and write memory; that is, you can repeatedly write data into RAM and read data from RAM. This is in contrast to ROM (read-only memory), which generally only permits the user in routine operation to read data already stored on the ROM. Most RAM is volatile, which means that it requires a steady flow of electricity to maintain its contents. As soon as the power is turned off, whatever data was in RAM is lost.

Computers almost always contain a small amount of ROM that holds instructions for starting up the computer. Unlike RAM, ROM generally cannot be written to in routine operation. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. Many modem PCs have their BIOS stored on a flash memory chip so that it can easily be updated if necessary. Such a BIOS is sometimes called a flash BIOS. Flash memory is also popular in modems because it enables the modem manufacturer to support new protocols as they become standardized.

A typical Flash memory comprises a memory array that includes a large number of memory cells arranged in row and column fashion. Each of the memory cells includes a floating gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Asynchronous DRAM (SDRAM) is a type of DRAM that can run at much higher clock speeds than conventional DRAM memory. SDRAM synchronizes itself with a CPU's bus and is capable of running at 100 MHZ, about three times faster than conventional FPM (Fast Page Mode) RAM, and about twice as fast EDO (Extended Data Output) DRAM and BEDO (Burst Extended Data Output) DRAM. SDRAMs can be accessed quickly, but are volatile. Many computer systems are designed to operate using SDRAM, but would benefit from non-volatile memory.

Many SDRAM devices are housed in packages that have an industry-standard pin layout and are of specified lengths and widths, such as a TSOP (thin, small-outline package) having a width of about 400 mils and a length dependent upon the number of pins. Memory chips in known TSOP memory packages have been oriented lengthwise within the package, as illustrated in FIG. 1A, and orthogonally within the package, as illustrated in FIG. 1B. FIGS. 1A and 1B depict industry-standard pin layouts for 44-pin SDRAM TSOP packages.

In the assembly depicted in FIG. 1A, memory chip 60 is oriented lengthwise within the package 62 with the major axis of the memory chip 60 extending substantially parallel to the major axis of the package 62. In the memory chip 60 of FIG. 1A, chip bond pads are located at opposite ends of the memory chip 60.

In the assembly depicted in FIG. 1B, memory chip 60 is oriented orthogonally within the package 62 with the major axis of the memory chip 60 extending substantially perpendicular to the major axis of the package 62. In the memory chip 60 of FIG. 1B, chip bond pads are located between the banks of memory arrays, or memory banks 64, located on memory chip 60.

For either assembly type, the chip bond pads correspond to interconnect pins of the package 62, such as address pins, data pins, clock and control signal pins, and power input pins. In general, there is a one-to-one relationship between the chip bond pads of a memory chip 60 and the interconnect pins of a package 62. However, certain interconnect pins may couple to more than one chip bond pad. The chip bond pads of the memory chip 60 are coupled to the interconnect pins of the package 62 in a conventional manner.

Integrated circuit chips, such as memory chips 60, are generally powered using a supply potential, such as VCC, and a ground potential, such as VSS. The industry-standard pin layouts for current SDRAM packages require power input pins for the ground potential VSS on a first side 74 of the package 62 and power input pins for the supply potential VCC on a second and opposite side 76 of the package 62. VCC power chip bond pads 66 are generally located on opposing ends of the memory chip 60 and are coupled to the VCC power input pins located near their corresponding end. For example, VCC power chip bond pads 66 located adjacent end 70 of the package 62 are coupled to the VCC power input pin located near end 70 while VSS power chip bond pads 68 located adjacent end 72 of the package 62 are coupled to the VSS power input pin located near end 72. To simplify the drawings, remaining chip bond pads, such as clock and control signal chip bond pads CLK, CKE, DQM, RAS#, CAS#, WE# and CS#, data chip bond pads DQ0–DQ7, address chip bond pads A0–A10 and BA, and DQ power input chip bond pads VCCQ and VSSQ, are not labeled in FIGS. 1A–1B.

As memory devices continue increasing in overall memory size and speed, power distribution becomes more critical especially as design rules continue to decrease. However, the industry-standard pin layouts restrict the ability of the designer to freely place power chip bond pads 66 and 68 around the memory chip as all VCC power input pins are on one side 76 of the package 62 while all VSS power input pins are on the opposite side 74 of the package 62.

Furthermore, to reduce undesirable parasitics, the VCC power chip bond pads 66 are usually coupled by a power connection internal to the memory chip 60. Likewise, the VSS power chip bond pads 68 are usually coupled by a second power connection internal to the memory chip 60. These power connections may take the form of a semiconductor die metalization layer. Such power connections use a significant amount of die real estate to connect these sources together properly, thus increasing costs and reducing production capacity. Furthermore, if the IR (inductance/resistance) drop along these power connections is too high, voltage drops or fluctuations may create undesirable signal characteristics within the integrated circuit. These concerns are magnified for those architectures having the memory device located between the power chip bond pads.

For the reasons stated above, and for other reasons stated below which will become apparent to those skilled in the art upon reading and understanding the present specification, there is a need in the art for alternate architecture and assembly of semiconductor memory devices.

SUMMARY OF THE INVENTION

The above-mentioned problems with memory devices and other problems are addressed by the present invention and will be understood by reading and studying the following specification.

The invention includes memory assemblies and their components adapted for memory chips having chip bond pads interposed between a memory device and each side of the memory chip. Embodiments include memory chips having power input chip bond pads for receiving a power input, with at least one of the power input chip bond pads located in each of at least three quadrants of the memory chip. Further embodiments include lead-over-chip leadframes and memory assemblies for coupling a single memory package interconnect pin to chip bond pads located on both sides of the memory chip, regardless of the location of the interconnect pin. Embodiments include memory chips in memory assemblies having chip bond pads on both sides of the memory chip shorted to each other by a single lead of a lead-over-chip leadframe.

For one embodiment, the invention provides a memory chip. The memory chip includes a substrate having four quadrants, a memory device fabricated on the substrate, and a plurality of first power input chip bond pads for receiving a first power input. The plurality of first power input chip bond pads are fabricated on the substrate and are coupled to the memory device. At least one of the first power input chip bond pads is located in each of at least three of the quadrants of the substrate. For another embodiment, the memory device contained in the memory chip is a synchronous flash memory device having an array of non-volatile flash memory cells and a command execution logic for receiving at least a system clock input signal and for generating commands to control operations performed on the array of non-volatile flash memory cells, wherein the commands are synchronized to the system clock input signal.

For a further embodiment, the invention provides a memory chip. The memory chip includes a substrate having a first side substantially parallel to a major axis of the memory chip and having two ends and a center, a second side substantially parallel to the major axis and having two ends and a center, and four corners. A corner is located at each end of the first and second sides. The memory chip further includes a memory device fabricated on the substrate. The memory chip still further includes at least five first power input chip bond pads for coupling the memory device to a supply potential. At least one first power input chip bond pad is located near each of three corners, at least one first power input chip bond pad is located near the center of the first side, and at least one first power input chip bond pad is located near the center of the second side. The memory chip still further includes at least five second power input chip bond pads for coupling the memory device to a ground potential. At least one second power input chip bond pad is located near each of three corners, at least one second power input chip bond pad is located near the center of the first side, and at least one second power input chip bond pad is located near the center of the second side.

For a further embodiment, the invention provides a lead-over-chip leadframe for a memory package having a pin layout substantially similar to an industry-standard SDRAM pin layout. The leadframe includes a first side, a second side opposite the first side, and a centerline between the first and second sides. At least one lead originating from the first side of the leadframe has terminations on each side of the centerline.

The invention further provides memory chips, leadframes and assemblies of various scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and terms wafer or substrate include the underlying layers containing such regions/junctions. The following detailed description is, therefore, not to be taken in a limiting sense, and the scope of the present invention is defined only by the appended claims and equivalents thereof.

Figure 1A:
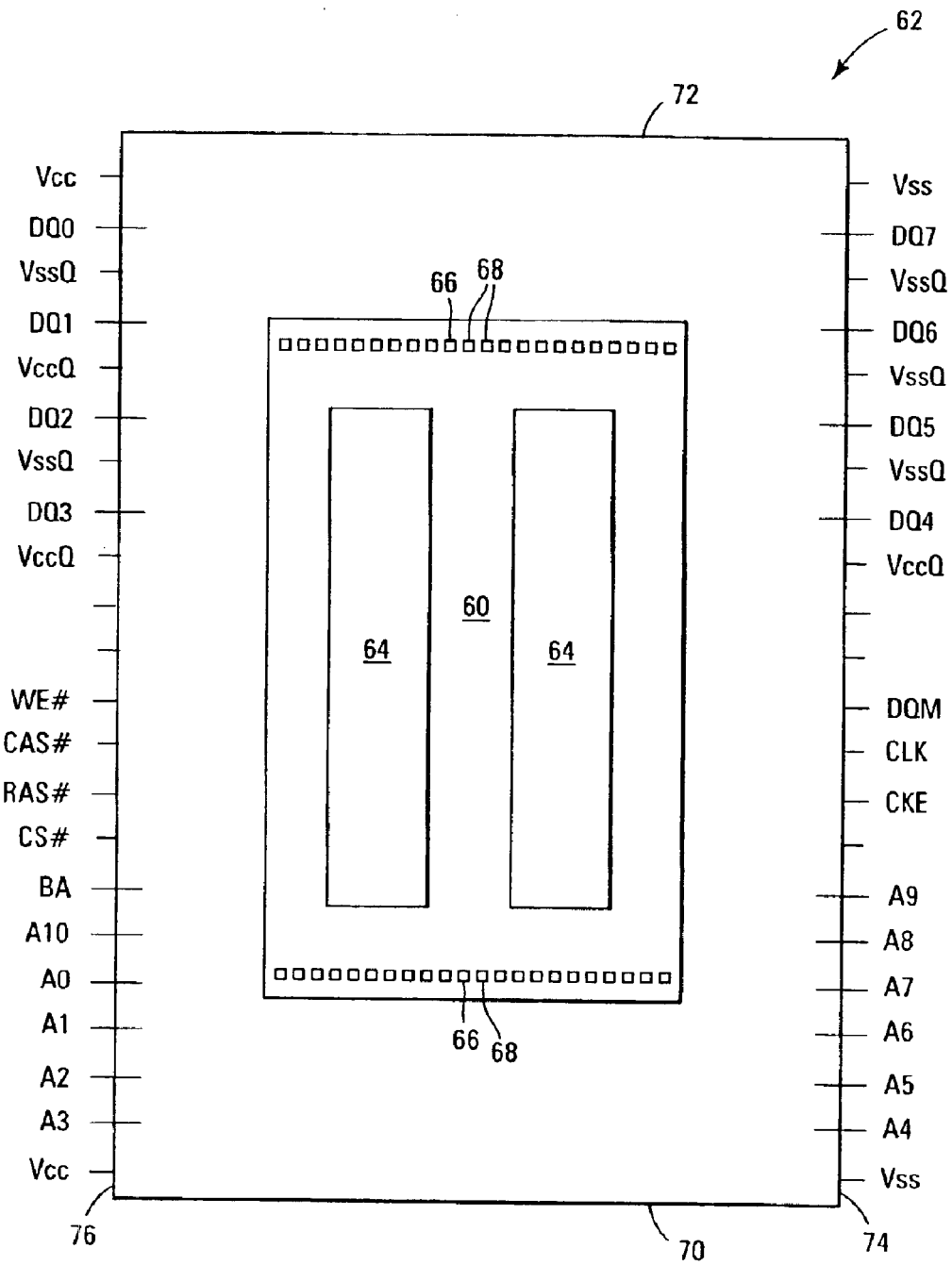
FIG. 1A is a schematic of one known memory assembly having a lengthwise orientation.
Figure 1B:
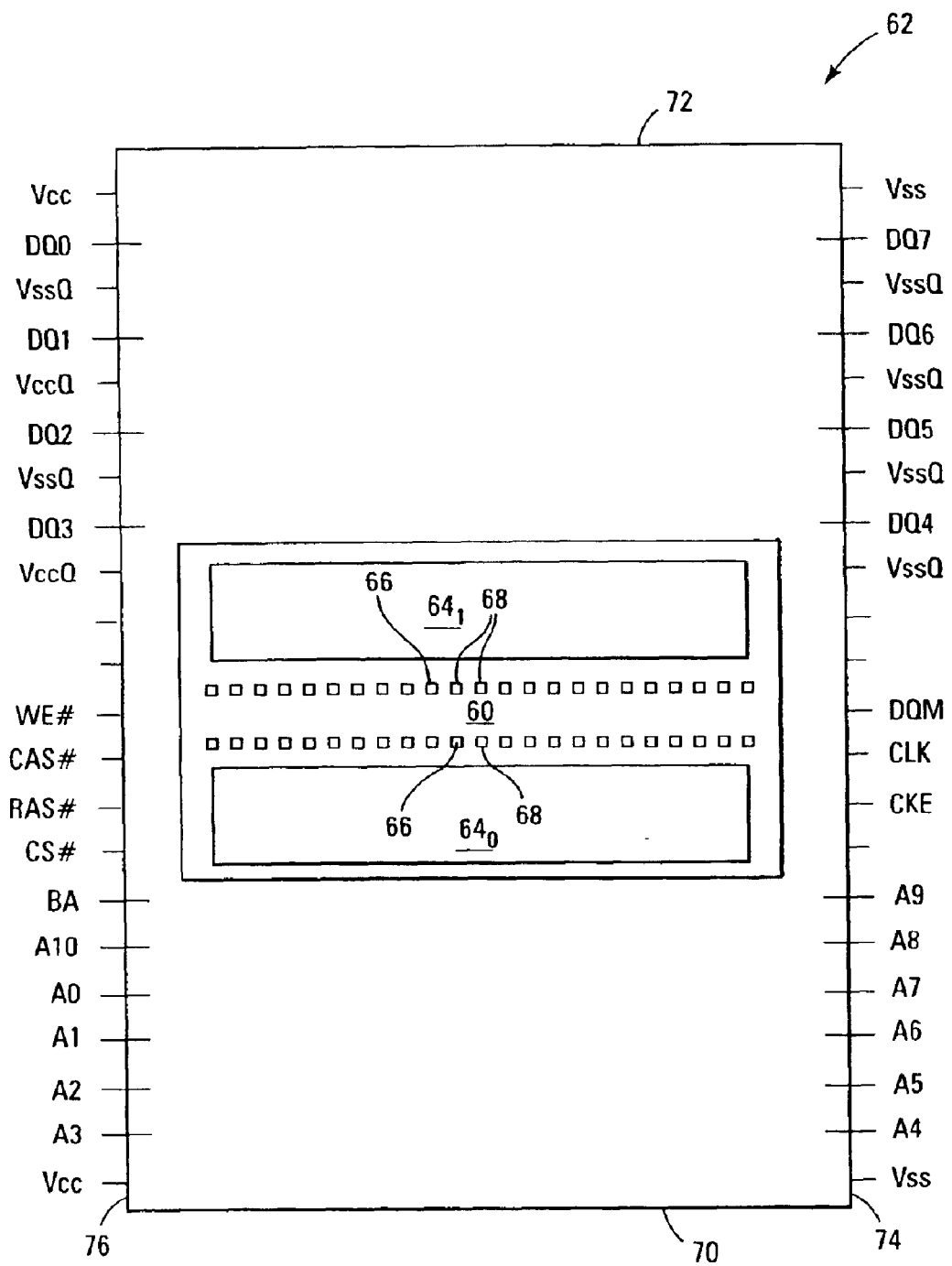
FIG. 1B is a schematic of another known memory assembly having an orthogonal orientation.
Figure 2:
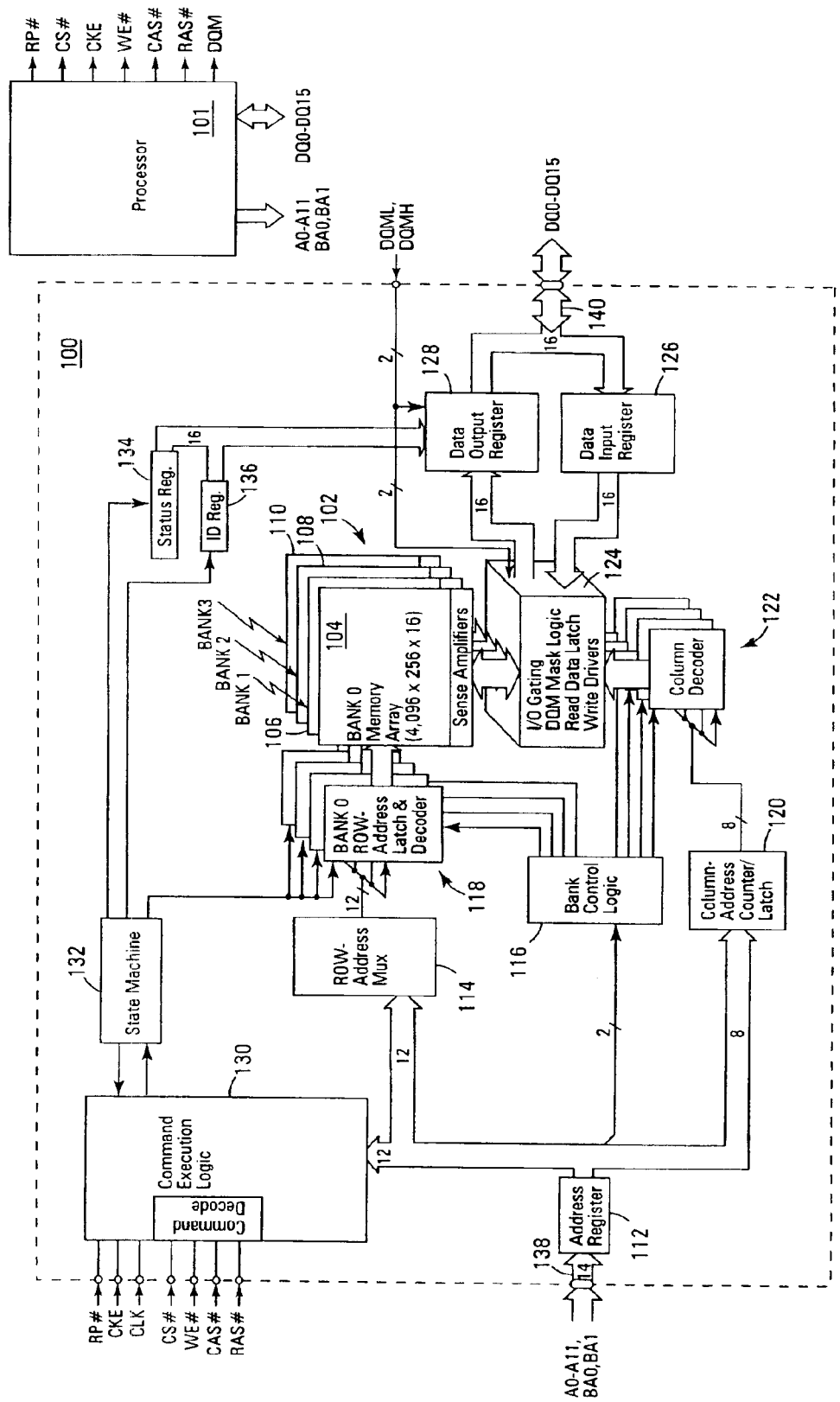
FIG. 2 is a block diagram of a memory device in accordance with the invention.

Referring to FIG. 2, a block diagram of one embodiment of the present invention is described. The memory device 100 includes an array of non-volatile flash memory cells 102. All access commands of the memory device 100 are synchronized to a system clock input signal (CLK), thus the memory device 100 may be referred to as a synchronous flash memory device. The array is arranged in a plurality of addressable banks. In one embodiment, the memory contains four memory banks 104, 106, 108 and 110. Each memory bank contains addressable sectors of memory cells. The data stored in the memory can be accessed using externally provided location addresses received by address register 112 through a plurality of address inputs 138. The externally provided location addresses may be provided by a processor 101 of an electronic system as is known in the art. The addresses are decoded using row address multiplexer circuitry 114. The addresses are also decoded using bank control logic 116 and row address latch and decode circuitry 118. To access an appropriate column of the memory, column address counter and latch circuitry 120 couples the received addresses to column decode circuitry 122. Circuit 124 provides input/output (I/O) gating, data mask logic, read data latch circuitry and write driver circuitry. Data is input through data input registers 126 and output through data output registers 128 using a plurality of data inputs/outputs 140, which are generally coupled to the processor 101 of an electronic system. Command execution logic 130 is provided to generate commands to control the basic operations performed on the memory banks of the memory device. A state machine 132 is also provided to control specific operations performed on the memory banks. A status register 134 and an identification register 136 can also be provided to output data. The command circuit 130 and/or state machine 132 can be generally referred to as control circuitry to control read, write, erase and other memory operations. As is known in the art, integrated circuit memory devices of the type described with reference to FIG. 2 may be fabricated on a substrate, such as a semiconductor die, and may be referred to as a memory chip.

Figure 3:
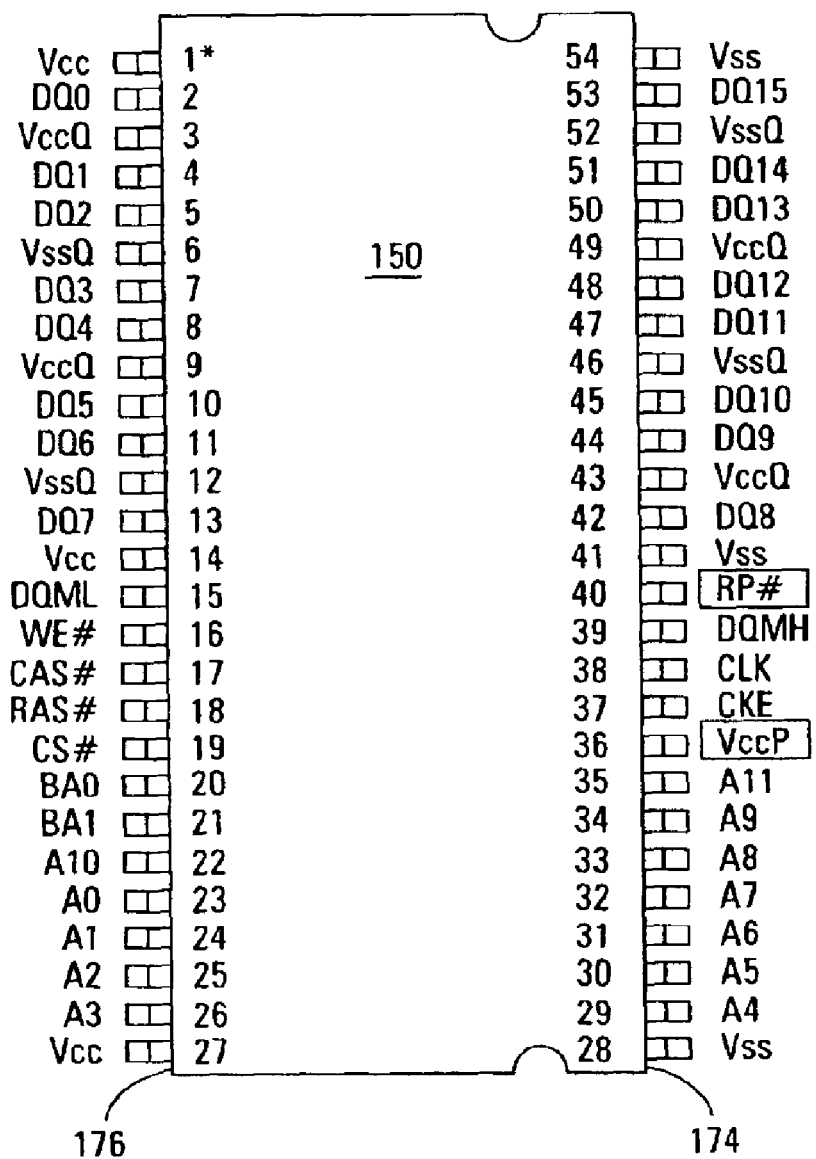
FIG. 3 is a top view of a memory assembly showing a package pin interconnect diagram in accordance with the invention.

FIG. 3 illustrates an interconnect pin assignment of one embodiment of the present invention as a memory assembly having a pin layout substantially similar to a standard SDRAM 54-pin TSOP package. Accordingly, the memory assembly has a memory package 150 having 54 interconnect pins. The memory package 150 has n interconnect pins on each side, with n equal to 27 for the embodiment depicted in FIG. 3. The memory package 150 may have some other number of interconnect pins.

The interconnect pins of a memory package 150 generally number 1 through n proceeding numerically from the top to the bottom of the memory package 150 on side 176 and n+1 through 2n proceeding numerically from the bottom to the top of the memory package 150 on side 174. Thus the first pin on the top of side 176 is number 1, the center pin on side 176 (if n is odd) is number (n+1)/2, the last pin on the bottom of side 176 is n, the first pin on the bottom of side 174 is number (n+1), the center pin on side 174 (if n is odd) is number (3n+1)/2, and the last pin on the top of side 174 is number 2n.

The memory package 150 contains a memory chip (not shown in FIG. 3) in accordance with the invention. As such, the memory package 150 may contain a synchronous flash memory device. Two interconnects shown in the embodiment of FIG. 3 and not present in standard SDRAM packages include control signal RP# and power input VCCP. Although knowledge of the function of the various clock and control signals and the various power inputs is not essential to understanding the present invention, a detailed discussion is included in U.S. patent application Ser. No. 09/567,733 filed May 10, 2000 and titled, "Flash with Consistent Latency," which is commonly assigned. Furthermore, the invention is not limited to memory packages having pin layouts substantially similar to an industry-standard SDRAM pin layout, but is applicable to other memory packages using a leadframe having composite leads for coupling an interconnect pin to chip bond pads located in multiple quadrants of a memory chip or on opposite sides of the memory chip.

Figure 4:
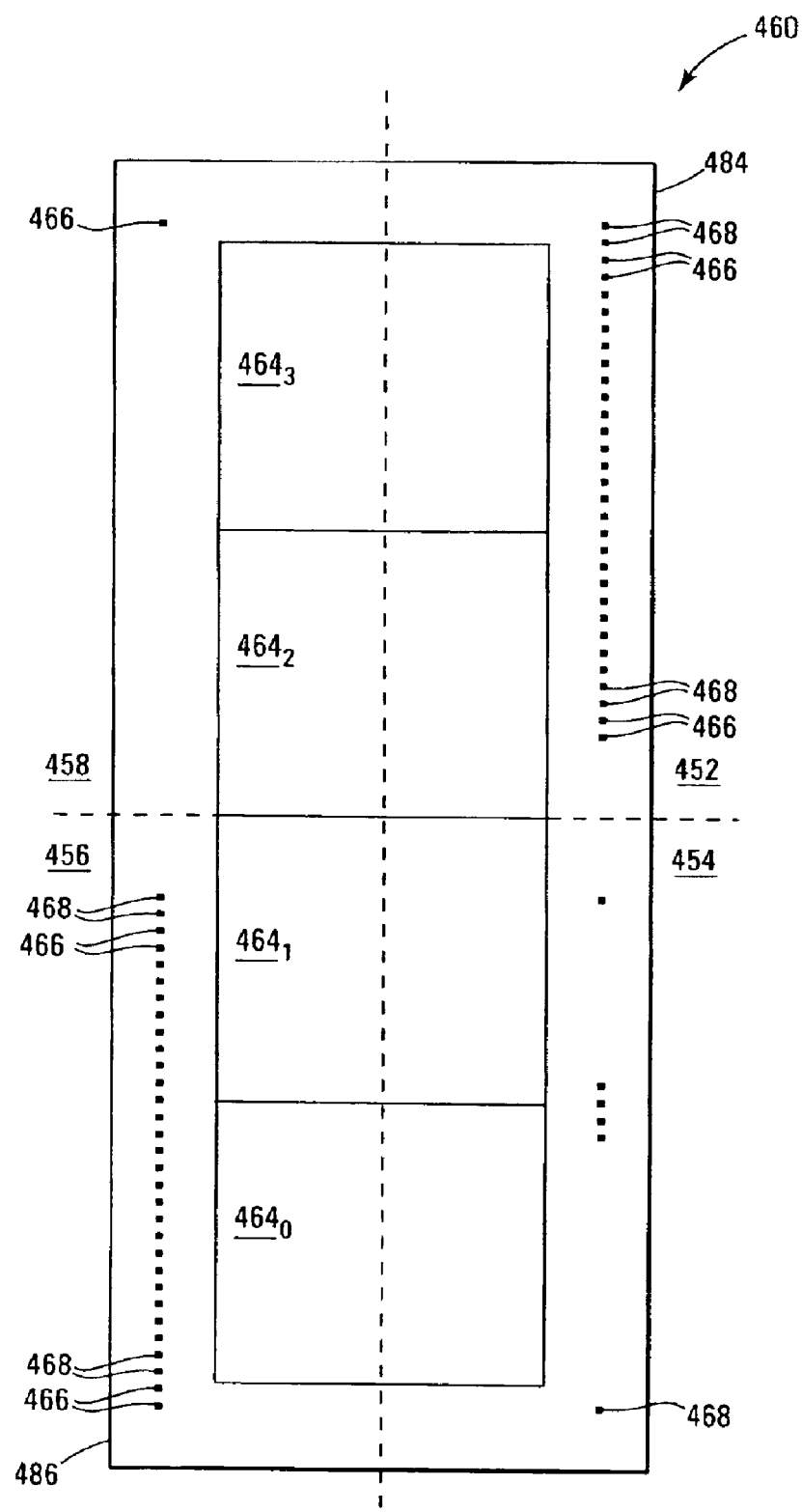
FIG. 4 is a schematic of a memory chip in accordance with the invention.

FIG. 4 depicts a simplified schematic of a memory chip 460 having four memory banks 4640–4643. While the memory banks 464 have been shown as a substantially contiguous structure, there is no requirement that the memory banks 464 be physically adjoining. However, reducing spacing between the memory banks 464 may provide improvements in die efficiency. The various embodiments facilitate reductions in spacing by eliminating the need to run a low IR power connection from one side of the memory chip 460 to the other as part of the fabrication process; as described below, a leadframe may be used to couple the power input chip bond pads on both sides of the memory chip 460. Memory chip 460 may contain a synchronous flash memory device as described with reference to FIG. 2. Memory chip 460 may alternatively contain other memory devices or other numbers of memory banks. The memory chip 460 is arranged to be mounted in a memory package with the major axis of the memory chip 460 aligned substantially parallel with the major axis of its memory package.

The memory chip 460 has at least two sets of power input chip bond pads for coupling to the power input pins of a memory package. A first set of power input chip bond pads may correspond to the supply potential, or VCC, power input pins of the memory package 150. Such VCC power input chip bond pads 466 are coupled to the various elements of the memory device through a first power bus for the distribution of power within the memory chip 460. A second set of power input chip bond pads may correspond to the ground potential, or VSS, power input pins of the memory package 150. Such VSS power input chip bond pads 468 are coupled to the various elements of the memory device through a second power bus for the distribution of power within the memory chip 460. The various chip bond pads are fabricated on the substrate as part of the memory chip 460.

The VCC power input chip bond pads 466 and VSS power input chip bond pads 468 are located adjacent a first side 484 and a second side 486 of the memory chip 460 (or substrate). The power input chip bond pads 466 and 468 are interposed between the memory banks 464 and the sides 484 and 486 of the memory chip 460 (or substrate).

For one embodiment, at least one VCC power input chip bond pad 466 is located in each of at least three quadrants of the memory chip 460. As the quadrants of the memory chip 460 correspond to the quadrants of the substrate on which the memory device is fabricated, the terms may be used interchangeably. For the embodiment depicted in FIG. 4, two VCC power input chip bond pads 466 are located in the first quadrant 452, four VCC power input chip bond pads 466 are located in the third quadrant 456, and one VCC power input chip bond pad 466 is located in the fourth quadrant 458.

For one embodiment, at least one VSS power input chip bond pad 468 is located in each of at least three quadrants of the memory chip 460. For the embodiment depicted in FIG. 4, two VSS power input chip bond pads 468 are located in the first quadrant 452, one VSS power input chip bond pad 468 is located in the second quadrant 454, and four VSS power input chip bond pads 468 are located in the third quadrant 456.

Although not labeled in FIG. 4, remaining chip bond pads include clock and control signal chip bond pads, data chip bond pads, and address chip bond pads. A more detailed discussion of such remaining chip bond pads is included in U.S. patent application Ser. No. 09/642,683 filed Aug. 21, 2000 and titled, "Architecture, Package Orientation and Assembly of Memory Devices," which is commonly assigned.

The memory chip 460 of FIG. 4 offers certain advantages. By placing power input chip bond pads around the perimeter of the memory chip 460, power distribution within the memory chip 460 may be improved. Such placement of power input chip bond pads can be used to reduce the potential for hot spots, to reduce the inductance of the power distribution buses, and to increase the ability of the integrated circuit device to handle surges in current.

For one embodiment, at least one power input chip bond pad 466 or 468 is located near each corner of the memory chip 460. For another embodiment, at least one power input chip bond pad 466 or 468 is further located near the center of each side 484 and 486 of the memory chip 460.

To couple the chip bond pads of memory chip 460 to the pins of a memory package, an LOC (lead-over-chip) leadframe may be used. LOC leadframes are well known in the art of packaging semiconductor chips. LOC leadframes generally contain a pressure-sensitive adhesive portion for securing the chip and a plurality of conductive leads for coupling the chip bond pads to pins of a semiconductor package. As the general construction, alignment and use of such LOC leadframes is well known, the following discussion will be limited to those factors that are pertinent to the various embodiments of the invention.

Figure 5:
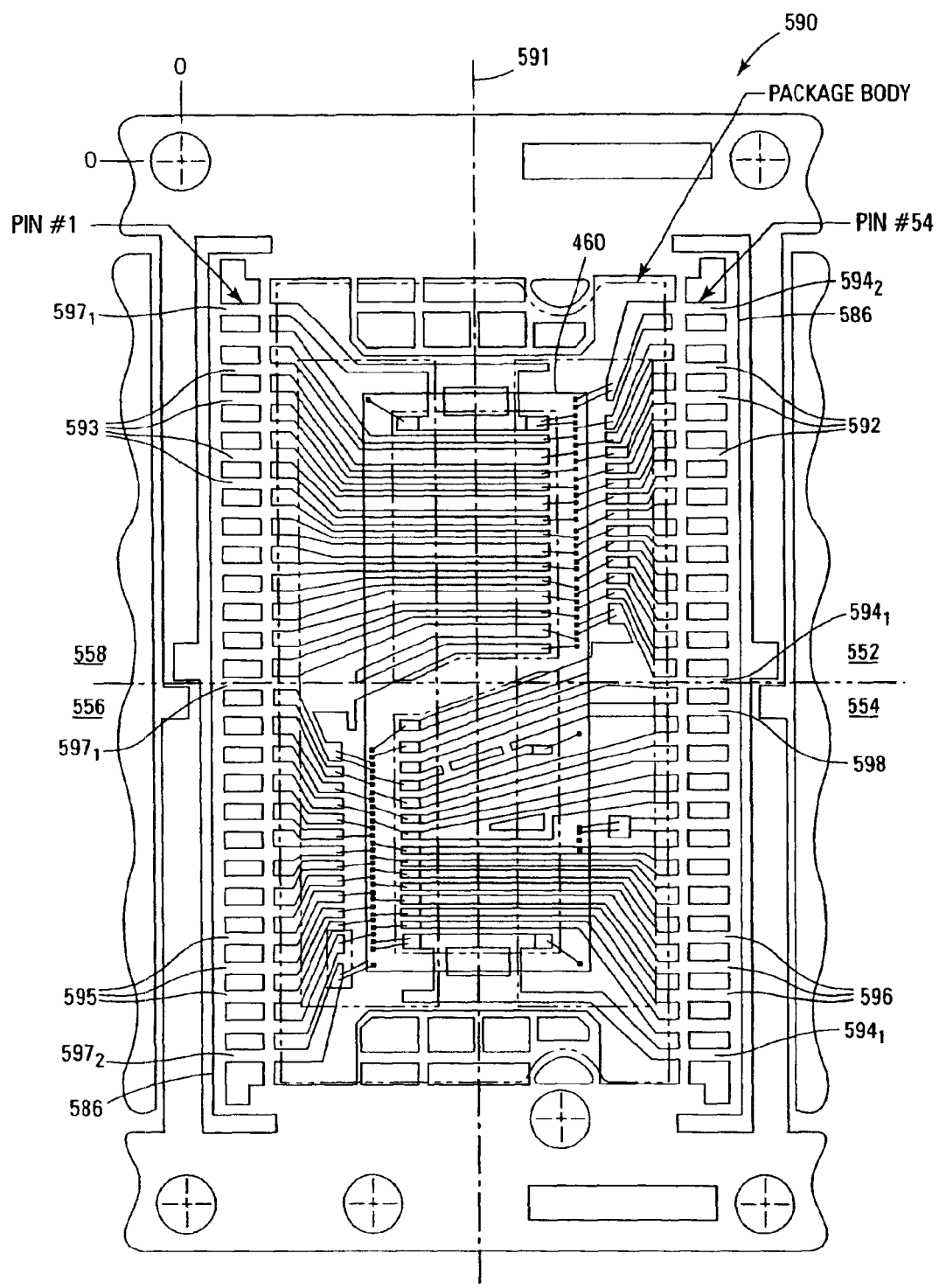
FIG. 5 is an assembly detail drawing of a lead-over-chip leadframe attached to a chip in accordance with the invention.

FIG. 5 is an assembly detail drawing showing attachment of a memory chip 460 to an LOC leadframe 590. As shown, the LOC leadframe 590 is adapted for coupling chip bond pads of memory chip 460 to the interconnect pins of memory package 150. Accordingly, the LOC leadframe 590 has leads having a one-to-one correspondence to the interconnect pins of memory package 150.

A first plurality of leads includes short leads, such as lead 592, extending from side 584 of the LOC leadframe 590 and originating in a first quadrant 552. Leads 592 correspond to data pins on side 174 of the memory package 150. The term "short" as used herein does not directly relate to physical length. As used herein, a lead is short if it terminates between a centerline 591 of the LOC leadframe 590 and the side from which it extends. Stated alternatively, a lead is short if it terminates in the same quadrant from which it originates. A second plurality of leads includes long leads, such as leads 593, extending from side 586 of the LOC leadframe 590 and originating in a fourth quadrant 558. Leads 593 correspond to data pins on side 176 of the memory package 150. The term "long" as used herein does not directly relate to physical length. As used herein, a lead is long if it terminates between the centerline 591 of the LOC leadframe 590 and the side opposite from which it extends. Stated alternatively, a lead is long if it terminates in a quadrant other than the quadrant from which it originates.

A third plurality of leads includes short leads, such as leads 595, extending from the side 586 of the LOC leadframe 590 and originating in the third quadrant 556. Leads 595 correspond to address pins on side 176 of the memory package 150. A fourth plurality of leads includes long leads, such as leads 596, extending from the side 584 of the LOC leadframe 590 and originating in the second quadrant 554. Leads 596 correspond to address pins on side 174 of the memory package 150.

A fifth plurality of leads includes composite leads 5941 and short lead 5942 extending from side 584 of the LOC leadframe 590. A lead is a composite lead, such as leads 5941, if it is a composite of short and long leads and thus has terminations on each side of the centerline 591 or in multiple quadrants. Composite leads, when coupled to chip bond pads of the memory chip 460, effectively short a chip bond pad on one side of the memory chip 460 to a chip bond pad on the other side of the memory chip 460. The fifth plurality of leads corresponds to VSS power input pins on side 174 of the memory package 150. Use of a composite lead permits location of VSS power input chip bond pads 468 in multiple quadrants and on opposite sides of the memory chip 460 for coupling to a single VSS power input pin of the memory package 150. Accordingly, the plurality of leads corresponding to the VSS power input pins includes at least one composite lead 5941. For one embodiment, a majority of the leads corresponding to the VSS power input pins are composite leads. For another embodiment, each VSS power input pin corresponds to at least two VSS power input chip bond pads 468. For a further embodiment, the number of VSS power input chip bond pads 468 is at least two times the number of VSS power input pins of the memory package. For yet another embodiment, the number of VSS power input chip bond pads 468 is equal to or greater than three times the number of VSS power input pins of the memory package.

A sixth plurality of leads includes composite leads 5971 and short lead 5972 extending from side 586 of the LOC leadframe 590. The sixth plurality of leads corresponds to VCC power input pins on side 176 of the memory package 150. Use of a composite lead permits location of VCC power input chip bond pads 466 in multiple quadrants and on opposite sides of the memory chip 460 for coupling to a single VCC power input pin of the memory package 150. Accordingly, the plurality of leads corresponding to the VCC power input pins includes at least one composite lead 5971. For one embodiment, a majority of the leads corresponding to the VCC power input pins are composite leads. For another embodiment, each VCC power input pin corresponds to at least two VCC power input chip bond pads 466. For a further embodiment, the number of VCC power input chip bond pads 466 is at least two times the number of VCC power input pins of the memory package. For yet another embodiment, the number of VCC power input chip bond pads 466 is equal to or greater than three times the number of VCC power input pins of the memory package.

The composite leads 5941 effectively allow use of a single VSS power input pin to provide the ground potential VSS to both sides 484 and 486 of the memory chip 460 without routing a power connection through the semiconductor die. The composite leads 5971 effectively allow use of a single VCC power input pin to provide the supply potential VCC to both sides 484 and 486 of the memory chip 460 without routing a power connection through the semiconductor die. The composite leads 5941 and 5971 thus act as another level of metalization on the die without impacting on the die real estate. Furthermore, as the leads of the LOC leadframe 590 are generally much wider and thicker than a typical semiconductor die metalization layer, the IR drops across the die can be greatly reduced using the composite leads 5941 and 5971 in lieu of a semiconductor die metalization layer.

As depicted in FIG. 5, one composite lead 5971 corresponding to pin #1 of the memory package 150 originates in a corner of the leadframe 590 in the fourth quadrant 558 and terminates in both the first quadrant 552 and the fourth quadrant 558. One composite lead 5941 corresponding to pin #28, or number n+1, of the memory package 150 further originates in an opposite corner of the leadframe 590 in the second quadrant 554 and terminates in both the second quadrant 554 and the third quadrant 556.

As further depicted in FIG. 5, one composite lead 5971 corresponding to center pin #14, or number (n+1)/2, of the memory package 150 originates from the side 586 of the leadframe 590 and terminates in both the first quadrant 552 and the third quadrant 556. One composite lead 5941 corresponding to center pin #41, or number (3n+1)/2, of the memory package 150 further originates from the opposite side 584 of the leadframe 590, yet also terminates in both the first quadrant 552 and the third quadrant 556.

For an embodiment such as that depicted in FIG. 5, three VCC power input chip bond pads 466 are located near corners of the memory chip 460 for coupling to pin #1 of the memory package 150; four VCC power input chip bond pads 466 are located near the center of a side of the memory chip 460 (two power input chip bond pads on each side 484 and 486 of the memory chip 460) for coupling to pin #14 of the memory package 150; two VCC power input chip bond pads 466 are located near a corner of the memory chip 460 for coupling to pin #27 of the memory package 150; three VSS power input chip bond pads 468 are located near corners of the memory chip 460 for coupling to pin #28 of the memory package 150; four VSS power input chip bond pads 468 are located near the center of a side of the memory chip 460 (two power input chip bond pads on each side 484 and 486 of the memory chip 460) for coupling to pin #41 of the memory package 150; and two VSS power input chip bond pads 468 are located near a corner of the memory chip 460 for coupling to pin #54 of the memory package 150. Providing supply potentials and ground potentials, such as VCC and VSS, to power input chip bond pads in corners and along the length of the memory chip improves internal power distribution, reduces hot spots and decreases signal noise, thus improving device operation and device integrity. Additional improvements may be possible by providing further additional power input chip bond pads.

Additional leads of the LOC leadframe 590 correspond to clock and control signal pins as well as DQ power input pins as is apparent from viewing FIG. 5 with reference to FIG. 3. Also shown in FIG. 5 is a composite lead 598 corresponding to pin #40 of the memory package 150. Composite lead 598 facilitates coupling the control signal RP# to chip bond pads in multiple quadrants and on both sides of the memory chip 460. Thus, the composite leads may correspond to interconnect pins other than power input pins.

As noted previously, memory devices are generally a component of an electronic system. In such electronic systems, a processor is coupled to the memory device, generally through the chip bond pads. Such coupling of a processor and a memory device may further include coupling the processor to the chip bond pads of a memory chip through the interconnect pins of a memory package and leads of a leadframe as described in accordance with the various embodiments of the invention.

CONCLUSION

Various embodiments of the invention have been shown for providing operational advantages in semiconductor memory devices through chip architecture and package assembly. The various embodiments of the invention include memory chips having a memory device coupled to first power input chip bond pads and second power input chip bond pads. Embodiments include at least one first power input chip bond pad located in each of at least three quadrants of the memory chip. Further embodiments include at least one second power input chip bond pad located in each of at least three quadrants of the memory chip. Embodiments include memory chips in memory assemblies having chip bond pads on both sides of the memory chip shorted to each other by a single lead of a lead-over-chip leadframe. Memory devices of various embodiments contain banks of non-volatile flash memory cells and have access commands synchronized to a system clock.

LOC leadframes may be used to couple the chip bond pads to the interconnect pins of the memory package to produce an integrated circuit memory assembly. LOC leadframes in accordance with the invention contain at least one composite lead for coupling an interconnect pin to chip bond pads located in multiple quadrants or on opposite sides of the memory chip.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. An electronic system, comprising:
   a processor; and
   a memory assembly, wherein the memory assembly comprises:
      a memory package having a plurality of interconnect pins coupled to the processor;
      a lead-over-chip leadframe having a plurality of leads coupled to the plurality of interconnect pins in a one-to-one relationship; and
      a memory chip coupled to the plurality of leads, wherein the memory chip comprises:
         a substrate;
         a memory device fabricated on the substrate; and
         a plurality of chip bond pads fabricated on the substrate and coupled to the memory device;
      wherein at least two leads originate from one side of the leadframe and are each coupled to at least two chip bond pads located in multiple quadrants of the substrate and wherein the at least two leads are not coupled to each other.

2. An electronic system, comprising:
   a processor; and
   a memory chip coupled to the processor, wherein the memory chip comprises:
      a substrate having four quadrants and further having two sides parallel a major axis of the substrate;
      a memory device fabricated on the substrate; and
      a plurality of first power input chip bond pads for receiving a first power input, the plurality of first power input chip bond pads fabricated on the substrate along each of the two sides and coupled to the memory device;

a plurality of second power input chip bond pads for receiving a second power input, the plurality of second power input chip bond pads fabricated on the substrate along each of the two sides and coupled to the memory device;

wherein at least one of the first power input chip bond pads is located in each of at least three of the quadrants of the substrate;

wherein at least one of the first power input chip bond pads is located near a center of each of the two sides;

wherein at least one of the second power input chip bond pads is located in each of at least three of the quadrants of the substrate; and wherein at least one of the second power input chip bond pads is located near a center of each of the two sides.

3. The electronic system of claim 2, wherein the first power input is a supply potential.

4. The electronic system of claim 2, wherein the first power input is a ground potential.

5. The electronic system of claim 2, wherein the first power input is a supply potential and the second power input is a ground potential.

6. The electronic system of claim 2, wherein at least one of the first power input chip bond pads is located in each of a first, second and third quadrants of the substrate and wherein at least one of the second power input chip bond pads is located in each of a first, third and fourth quadrants of the substrate.

7. An electronic system, comprising:

a processor; and a memory chip coupled to the processor, wherein the memory chip comprises:

a substrate having a first side substantially parallel to a major axis of the memory chip and having two ends and a center, a second side substantially parallel to the major axis and having two ends and a center, and four corners, wherein a corner is located at each end of the first and second sides;

a memory device fabricated on the substrate;

at least five first power input chip bond pads for coupling the memory device to a supply potential, wherein at least one first power input chip bond pad is located near each of three corners, at least one first power input chip bond pad is located near the center of the first side, and at least one first power input chip bond pad is located near the center of the second side; and at least five second power input chip bond pads for coupling the memory device to a ground potential, wherein at least one second power input chip bond pad is located near each of three corners, at least one second power input chip bond pad is located near the center of the first side, and at least one second power input chip bond pad is located near the center of the second side.

8. The electronic system of claim 7, wherein two first power input chip bond pads are located near a first corner, two first power input chip bond pads are located near a third corner, one first power input chip bond pad is located near a fourth corner, two first power input chip bond pads are located near the center of the first side, and two first power input chip bond pads are located near the center of the second side; and wherein two second power input chip bond pads are located near the first corner, one second power input chip bond pad is located near a second corner, two second power input chip bond pads are located near the third corner, two second power input chip bond pads are located near the center of the first side, and two second power input chip bond pads are located near the center of the second side.

9. An electronic system, comprising:

a processor; and a memory chip coupled to the processor, wherein the memory chip comprises:

a substrate having a first side substantially parallel to a major axis of the memory chip and having two ends and a center, a second side substantially parallel to the major axis and having two ends and a center, and four corners, wherein a corner is located at each end of the first and second sides;

a memory device fabricated on the substrate;

a first supply potential power input chip bond pad located near a first corner;

a second supply potential power input chip bond pad located near the center of the first side;

a third supply potential power input chip bond pad located near a third corner;

a fourth supply potential power input chip bond pad located near the center of the second side;

a fifth supply potential power input chip bond pad located near a fourth corner;

a first ground potential power input chip bond pad located near the first corner;

a second ground potential power input chip bond pad located near the center of the first side;

a third ground potential power input chip bond pad located near a second corner;

a fourth ground potential power input chip bond pad located near the third corner; and a fifth ground potential power input chip bond pad located near the center of the second side;

wherein each power input chip bond pad is coupled to the memory device.

10. The electronic system of claim 9, further comprising:

a sixth supply potential power input chip bond pad located near the first corner;

a seventh supply potential power input chip bond pad located near the center of the first side;

an eighth supply potential power input chip bond pad located near the third corner; and a ninth supply potential power input chip bond pad located near the center of the second side.

11. The electronic system of claim 9, further comprising:

a sixth ground potential power input chip bond pad located near the first corner;

a seventh ground potential power input chip bond pad located near the center of the first side;

an eighth ground potential power input chip bond pad located near the third corner; and a ninth ground potential power input chip bond pad located near the center of the second side.

12. An electronic system, comprising:

a processor; and a memory chip coupled to the processor, wherein the memory chip comprises:

a substrate having four quadrants between two sides, the sides being parallel a major axis of the substrate;

a memory device fabricated on the substrate;

a plurality of supply potential power input chip bond pads for receiving a supply potential, the plurality of supply potential power input chip bond pads fabricated on the substrate along each of the two sides and coupled to the memory device; and a plurality of ground potential power input chip bond pads for receiving a ground potential, the plurality of ground potential power input chip bond pads fabricated on the substrate along each of the two sides and coupled to the memory device;

wherein at least one of the supply potential power input chip bond pads is located in each of at least three of the quadrants of the substrate and near a center of each of the two sides; and wherein at least one of the ground potential power input chip bond pads is located in each of at least three of the quadrants of the substrate and near the center of each of the two sides.

13. The electronic system of claim 12, wherein at least one of the supply potential power input chip bond pads is located in each of a first, second and third quadrants of the substrate and wherein at least one of the ground potential power input chip bond pads is located in each of the first and third quadrants of the substrate and a fourth quadrant of the substrate.

14. An electronic system, comprising:

a processor; and a synchronous flash memory chip coupled to the processor, wherein the synchronous flash memory chip comprises:

a substrate having four quadrants and having two sides parallel a major axis of the substrate;

a memory device fabricated on the substrate between the two sides, wherein the memory device comprises:

an array of non-volatile flash memory cells; and a command execution logic for receiving at least a system clock input signal and for generating commands to control operations performed on the array of non-volatile flash memory cells, wherein the commands are synchronized to the system clock input signal; and a plurality of first power input chip bond pads for receiving a first power input, the plurality of first power input chip bond pads fabricated on the substrate interposed between the memory device and each of the two sides and coupled to the memory device;

wherein at least one of the first power input chip bond pads is located in each of at least three of the quadrants of the substrate and at least one of the first power input chip bond pads is located near a center of each of the two sides.

15. The electronic system of claim 14, further comprising:

a plurality of second power input chip bond pads for receiving a second power input, the plurality of second power input chip bond pads fabricated on the substrate interposed between the memory device and each of the two sides and coupled to the memory device;

wherein at least one of the second power input chip bond pads is located in each of at least three of the quadrants of the substrate and at least one of the second power input chip bond pads is located near the center of each of the two sides.

16. An electronic system, comprising:

a processor; and a synchronous flash memory chip coupled to the processor, wherein the synchronous flash memory chip comprises:

a substrate having a first side substantially parallel to a major axis of the synchronous flash memory chip and having two ends and a center, a second side substantially parallel to the major axis and having two ends and a center, and four corners, wherein a corner is located at each end of the first and second sides;

a memory device fabricated on the substrate, wherein the memory device comprises:

an array of non-volatile flash memory cells; and a command execution logic for receiving at least a system clock input signal and for generating commands to control operations performed on the array of non-volatile flash memory cells, wherein the commands are synchronized to the system clock input signal;

at least five first power input chip bond pads for coupling the memory device to a supply potential, wherein at least one first power input chip bond pad is located near each of three corners, at least one first power input chip bond pad is located near the center of the first side, and at least one first power input chip bond pad is located near the center of the second side; and at least five second power input chip bond pads for coupling the memory device to a ground potential, wherein at least one second power input chip bond pad is located near each of three corners, at least one second power input chip bond pad is located near the center of the first side, and at least one second power input chip bond pad is located near the center of the second side.

17. An electronic system, comprising:

a processor; and a synchronous flash memory chip coupled to the processor, wherein the synchronous flash memory chip comprises:

a substrate having a first side substantially parallel to a major axis of the synchronous flash memory chip and having two ends and a center, a second side substantially parallel to the major axis and having two ends and a center, and four corners, wherein a corner is located at each end of the first and second sides;

a memory device fabricated on the substrate, wherein the memory device comprises:

an array of non-volatile flash memory cells; and a command execution logic for receiving at least a system clock input signal and for generating commands to control operations performed on the array of non-volatile flash memory cells, wherein the commands are synchronized to the system clock input signal;

a first supply potential power input chip bond pad located near a first corner;

a second supply potential power input chip bond pad located near the center of the first side;

a third supply potential power input chip bond pad located near a third corner;

a fourth supply potential power input chip bond pad located near the center of the second side;

a fifth supply potential power input chip bond pad located near a fourth corner;

a first ground potential power input chip bond pad located near the first corner;

a second ground potential power input chip bond pad located near the center of the first side;

a third ground potential power input chip bond pad located near a second corner;
a fourth ground potential power input chip bond pad located near the third corner; and
a fifth ground potential power input chip bond pad located near the center of the second side;
wherein each power input chip bond pad is coupled to the memory device.

18. An electronic system, comprising:

a processor; and a synchronous flash memory chip coupled to the processor, wherein the synchronous flash memory chip comprises:
   a substrate having four quadrants and having two sides, the sides being parallel a major axis of the substrate;
   a memory device fabricated on the substrate between the two sides, wherein the memory device comprises:
   an array of non-volatile flash memory cells; and
   a command execution logic for receiving at least a system clock input signal and for generating commands to control operations performed on the array of non-volatile flash memory cells, wherein the commands are synchronized to the system clock input signal; and
   a plurality of supply potential power input chip bond pads for receiving a supply potential, the plurality of supply potential power input chip bond pads fabricated on the substrate interposed between the memory device and each of the two sides and coupled to the memory device; and
   a plurality of ground potential power input chip bond pads for receiving a ground potential, the plurality of ground potential power input chip bond pads fabricated on the substrate interposed between the memory device and each of the two sides and coupled to the memory device;
   wherein at least one of the supply potential power input chip bond pads is located in each of at least three of the quadrants of the substrate and at least one of the supply potential power input chip bond pads is located near a center of each of the two sides; and
   wherein at least one of the ground potential power input chip bond pads is located in each of at least three of the quadrants of the substrate and at least one of the ground potential power input chip bond pads is located near the center of each of the two sides.

* * * * *